United States Patent [19]

Ball et al.

[11] 4,109,199
[45] Aug. 22, 1978

[54] THREE AXIS MAGNETOMETER CALIBRATION CHECKING METHOD AND APPARATUS

[75] Inventors: Raymond L. Ball, Panama City; Paul G. Leverone, Panama City Beach; Warren H. Biegler, Panama City, all of Fla.

[73] Assignee: The United States of America as represented by the Secretary of the Navy, Washington, D.C.

[21] Appl. No.: 842,840

[22] Filed: Oct. 17, 1977

[51] Int. Cl.² ............... G01R 35/00; G01R 33/02
[52] U.S. Cl. ............................ 324/202; 324/244; 324/247
[58] Field of Search ............ 324/202, 244, 246, 247, 324/253–255, 260; 33/355, 356, 361

[56] References Cited

U.S. PATENT DOCUMENTS 3,778,703  12/1973  Jackson ..................... 324/247

Primary Examiner—Robert J. Corcoran
Attorney, Agent, or Firm—Richard S. Sciascia; Harvey A. David

[57] ABSTRACT

A three axis magnetometer is provided with a single calibration checking coil lying in a plane disposed at equal angles to each of the three orthogonal axes of sensitivity. Energization of the calibration checking coil with a known current while the calibrated magnetometer is in a known condition of calibration provides sensitivity readings for each of the three axes, which readings provide a standard of comparison for checking the calibration and sensitivity of the magnetometer by similar energization of the coil when the magnetometer is disposed in a remote operational environment.

7 Claims, 5 Drawing Figures

THREE AXIS MAGNETOMETER CALIBRATION CHECKING METHOD AND APPARATUS

BACKGROUND OF THE INVENTION

This invention relates generally to magnetometers and more particularly to the calibration of three axis magnetometers.

Three axis magnetometers, that is magnetometer devices having three mutually orthogonal magnetic field component sensing elements, are used in a variety of applications. For example, such a magnetometer can be used to determine magnetic characteristics or effects of magnetic minesweeping apparatus or to determine magnetic signatures of ships and other vessels or equipment. Magnetometers of the three axis type are also useful in a variety of other applications well known to those skilled in the art to which the invention pertains. Much attention has been paid to the problems of adjusting or correcting the magnetic sensors to overcome errors arising from a variety of factors that are difficult to control or predict in the manufacture and assembly of such devices. Adjustments, corrections and calibration of a magnetometer are typically carried out in an artificially controlled field situation generated by a Helmholtz room. The Helmholtz room comprises an enclosure defined by a plurality of coils arranged in mutually prependicular planes and energizeable to produce magnetic fields the components of which are capable of being rather accurately calculated. When the typical magnetometer has been adjusted and calibrated, it is then removed from the Helmholtz room and placed into service. The magnetometer generally is required to be carefully positioned, with its axes of sensitivity in known directions relative to the earth's magnetic field and, for certain applications, the magnetometer device is disposed in a location that is relatively inaccessible for recalibration, for example in an underwater test site from which readings are telemetered by cable to a remote control and data instrumentation station.

Now, magnetometers, by their nature, tend to be delicate and subject to changes in response and sensitivity due to handling, adverse magnetic conditions experienced between calibration and the time of use, and the like. Accordingly, whenever magnetometer data or readings are obtained during use that are not entirely consistent with those expected or predicted, the calibration and adjustment of the magnetometer itself becomes suspect. Heretofore, it has been necessary in such circumstances to retrieve the magnetometer, recalibrate and adjust it in a Helmholtz enclosure, replace it at the test site, and obtain new data. Of course such a procedure is time consuming, costly, and the validity of the data is still open to question in that the magnetometer may have suffered a duplicate loss of calibration.

SUMMARY OF THE INVENTION

With the foregoing in mind, it is a principal object of this invention to provide an improved magnetometer system which has the capability of monitoring or checking on the calibration of a magnetometer when in situ in an operational environment.

Another important object of the invention is the provision of an apparatus and method for determining the sensitivity of each of three magnetic field component sensors in a three axis magnetometer without the necessity of removing the magnetometer to a calibrating enclosure such as a Helmholz room.

As another object the invention aims to provide a method and apparatus, for magnetic field component measurements, which permits remote checking of a three axis magnetometer, forming part of the system, from a distant control and data instrumentation station, thereby effecting considerable savings in time and expense in generating reliable magnetic field data.

Yet another object is the provision of a three-axis magnetometer device incorporating calibration checking means and which is particularly compact, reliable, and inexpensive.

Still another object is the provision of magnetometer device of the foregoing character that is adapted for disposition at an underwater test site and comprises novel positioning means.

Other objects and many of the attendant advantages will be readily appreciated as the subject invention becomes better understood by reference to the following detailed description, when considered in conjunction with the accompanying drawings.

DESCRIPTION OF THE PREFERRED EMBODIMENT

Figure 1:
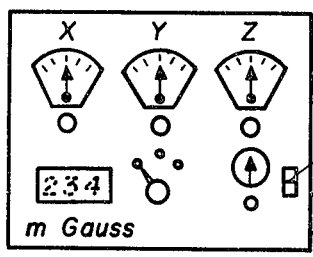
FIG. 1 is a view, partly in elevation and partly in section, illustrating a magnetometer system embodying the invention.

Referring first to FIG. 1, a three axis magnetometer system embodying the invention comprises a magnetometer assembly 10 that is disposed in an operational environment and connected by a cable 12 to a remote control and data instrumentation station 14. In this example the assembly 10, which includes a generally cylindrical housing 16, is intended for the sensing of magnetic field conditions at an underwater location and is held in a predetermined orientation by a cylindrical support sleeve 20. The sleeve 20 has its longitudinal axis generally upright, in this example, and has its lower end conveniently embedded in the bottom of a body of water forming part of the operational environment. An internal, longitudinally extending rib 22 in the sleeve 20 is adapted to cooperate with the magnetometer assembly 10 in positioning the magnetometer in a manner which will become apparent as this specification proceeds.

Figure 2:
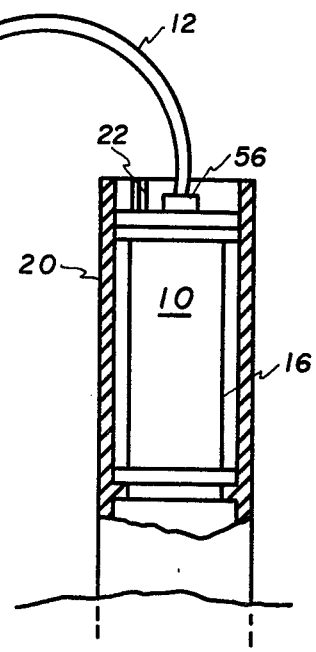
FIG. 2 is an enlarged sectional view illustrating a magnetometer, housing, and calibration checking coil assembly.
Figure 2:
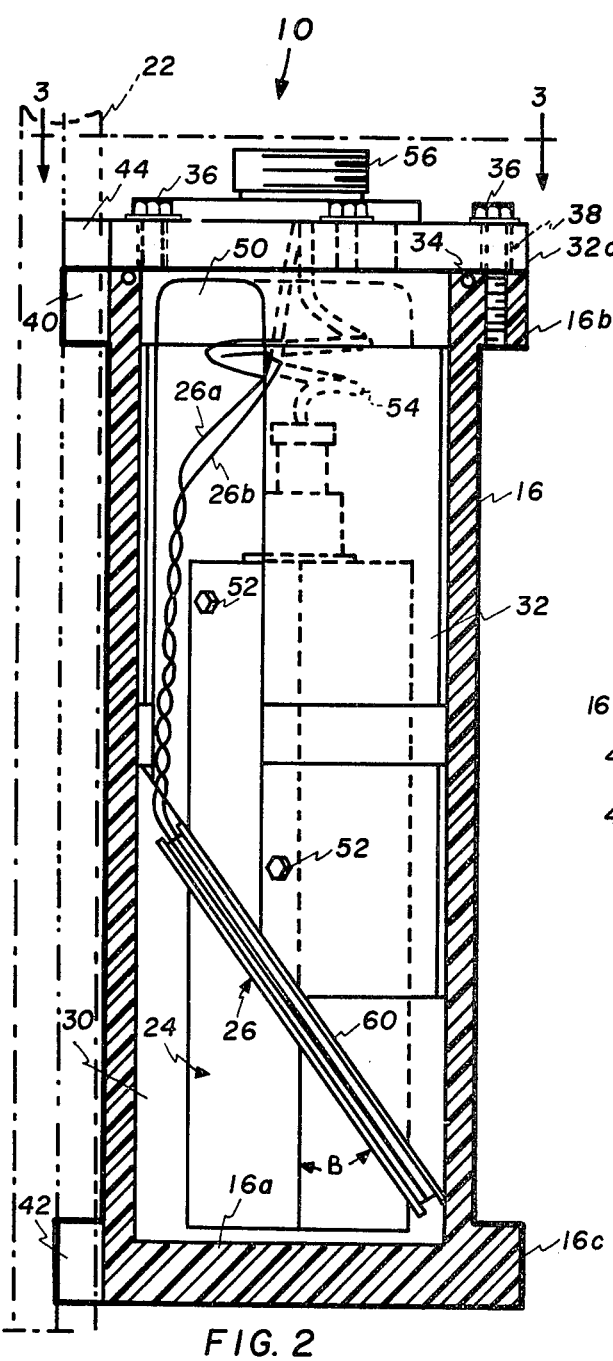
Figure 3:
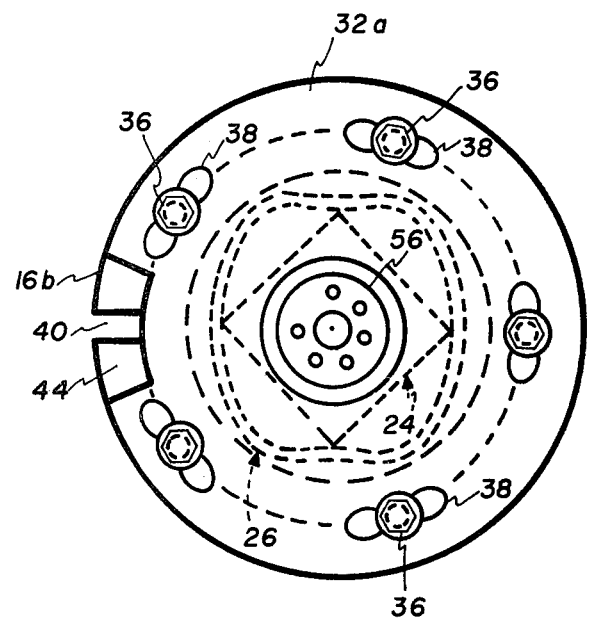
FIG. 3 is a plan view of the assembly taken along line 3—3 of FIG. 2.
Figure 4:
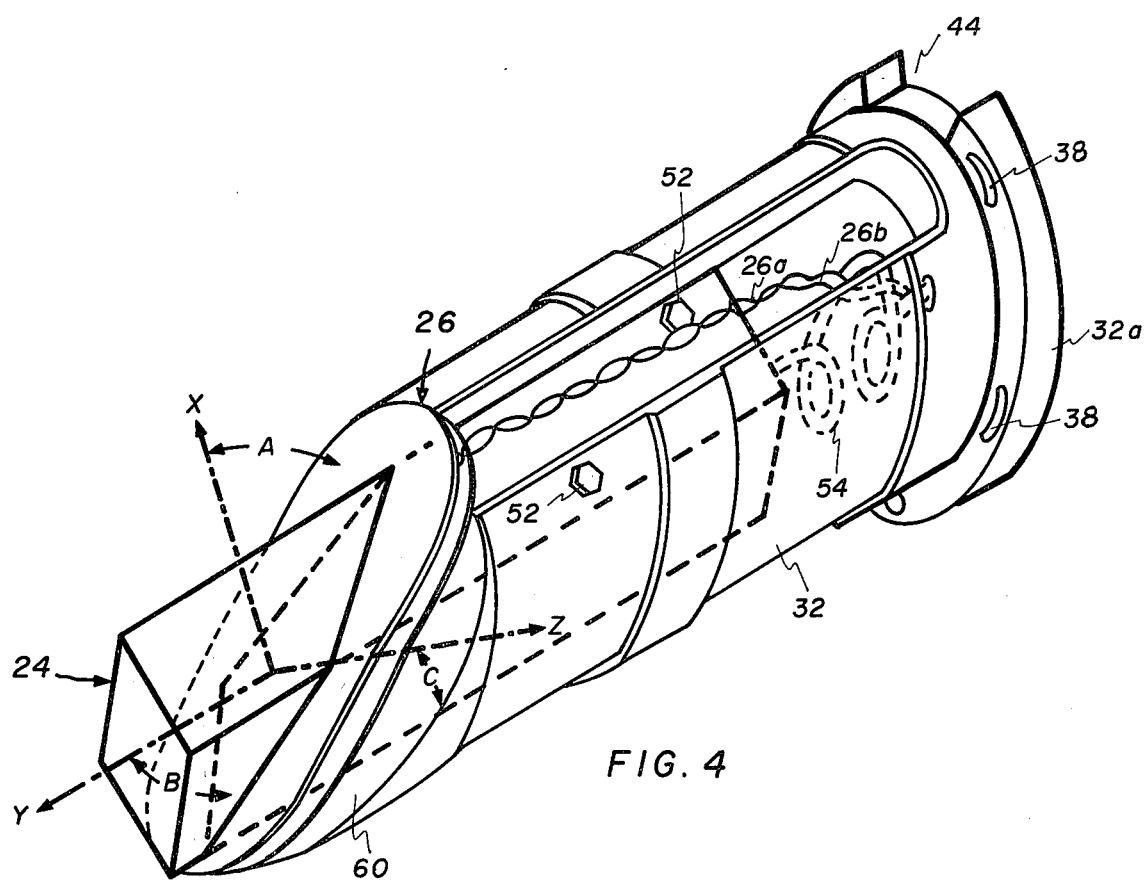
FIG. 4 is perspective view of the magnetometer, calibration checking coil, and holder portion of the assembly of FIG. 2.

Referring now additionally to FIGS. 2, 3, and 4, the magnetometer assembly 10 comprises, in addition to the housing 16, a three axis magnetometer 24 and a calibration checking coil 26. The magnetometer 24 may be any of a number of commercially available units and in this example comprises a Model 9210 magnetometer obtained from Develco, Incorporated, of Sunnyvale, California.

The magnetometer 24 is in the configuration of an elongated right parallelpiped having a substantially square cross-section, and is designed to measure magnetic field components along three mutually orthogonal axes $x$, $y$, and $z$. Conveniently, one axis, say the $y$ axis, is parallel to the longitudinal axis of the body of the magnetometer.

The housing 16, which defines a cylindrical cavity 30, is open at one end and closed at the other end 16a and is further provided with flanges 16b and 16c at the open and closed ends, respectively. The housing 16 is, of course, formed of a rigid non-magnetic material. A magnetometer and coil support member 32, having an end flange 32a, is adapted to slide into the housing 16 with the flanges 32a and 16b against one another and serves as a closure for the housing. An O-ring 34 is disposed between the housing 16 and support member 32 to render the assembly 10 watertight. Screws 36 secure the flange 32a to flange 16b, the former being provided with arcuate screw openings 38 to permit limited rotational adjustment of the support member 32, and the magnetometer 24 and coil 26 supported thereby, relative to the housing 16.

The flanges 16b and 16c are provided with notches 40, 42 that cooperate with the rib 22 in sleeve 20 to index the assembly 10 relative to the sleeve. The flange 32a is provided with a wider notch 44, that will clear the rib 22 irrespective of the adjusted position of the support member 32 relative to the housing 16 as permitted by the arcuate openings 38.

The support member 32 is provided with a recess 50 in which the magnetometer 24 is received and fixed as by pins or screws 52. A cable 54 having wires for energizing the magnetometer and carrying data signals therefrom, extends from the magnetometer 24 to a suitable multiple contact connector 56 mounted on the support member 32 and adapted to connect with the cable 12.

Figure 5:
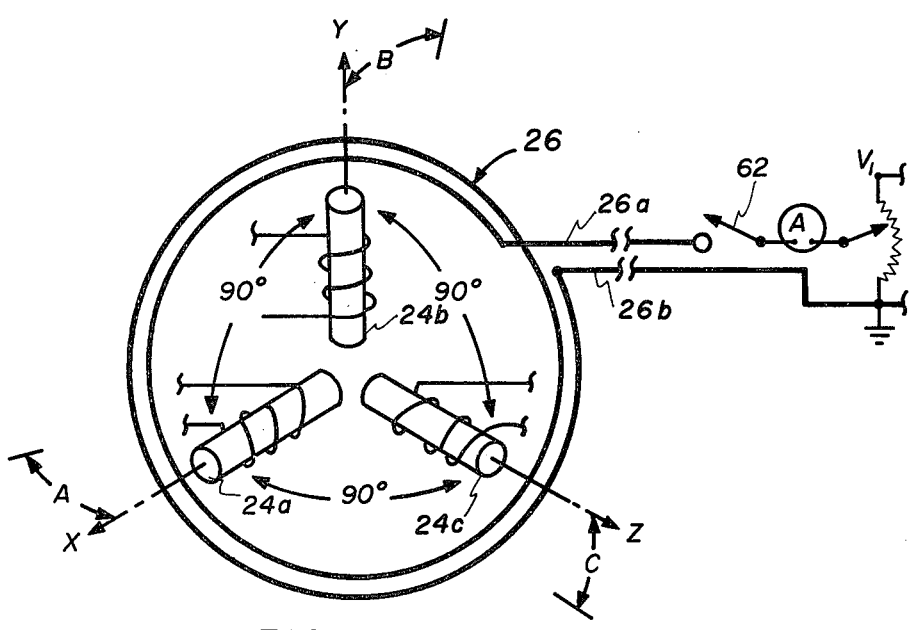
FIG. 5 is a diagrammatic view illustrating angular relationships between magnetometer sensors and the calibration checking coil.

The inner end of the support member 32 is formed as a plane surface 60 lying at a predetermined angle to the longitudinal axis of the magnetometer 24. The coil 26, which conveniently comprises several turns of wire wound on an oval coil form, is mounted on the support member 32 against that surface 60 so as to lie in a plane that makes predetermined equal angles with each of the magnetometer axes $x$, $y$, and $z$. The tangent of each of these angles A, B, and C is equal to $\sqrt{2}/2$. Each of the angles is therefore substantially equal to 35.264°. This relationship can best be visualized by reference to FIG. 5. In that view, consider the coil 26 to lie in the plane of the paper. The $x$, $y$, and $z$ axes are determined by the positions of three magnetometer sensor elements 24a, 24b, and 24c that lie in three mutually perpendicular planes so as to be orthogonal to one another. The equal angles A, B, and C are then defined between the axes $x$, $y$, and $z$ and the coil plane.

The coil 26 is connected, via wire leads 26a, 26b, and cable 12 to the control and instrumentation station 14. The station 14 provides suitable electrical power via cable 12 to the magnetometer for energization thereof, and receives electrical signals corresponding to magnetic field components sensed by the sensors 24a, 24b, 24c, for display on corresponding meters or indicators, usually in terms of milligauss. The station 14 can also be caused, upon activation of a suitable control 62, to energize the calibration coil 26 with a predetermined current, say one milliampere.

MODE OF OPERATION

In preparation for use, the magnetometer assembly 10 is placed in a location, such as helmholtz enclosure, having determinable magnetic field components. With the assembly so located, calibration and alignment adjustments and readings are made in accordance with the usual practice for the make and model of magnetometer 26 being used. At this time, and as part of the alignment procedures, the rotational position of the magnetometer holder 32, relative to the housing 16, may be adjusted. With the magnetometer assembly thus calibrated, the calibration checking coil 26 is energized with the mentioned predetermined current of, say, one milliampere and readings taken for the effects on the magnetic field as sensed by the magnetometer sensors.

The magnetometer assembly 10 is then removed to its location of use, e.g., in the support sleeve 20, wherein the rib 22 cooperates with the notch 40 in flange 16b to index the assembly. With the assembly 10 located in the sleeve 20 and ready for use in the desired operational environment, the calibration checking coil 26 may be again energized with the same predetermined current by actuation of control 62, to determine whether the magnetometer sensitivity to each of the three field components is substantially the same as when it was calibrated and adjusted in the Helmholtz enclosure.

In other words, energization of the coil 26 at different times but with the same amount of current should produce the same changes in the $x$, $y$, and $z$ meters of the station 14, irrespective of changes in location of the magnetometer or the strength of the fields at different locations, providing that no change in calibration has occurred. Thus, if one milliampere of current in coil 26 produces changes of 150, 160, and 165 milligauss in the respective readings of the $x$, $y$, and $z$ meters when the magnetometer has just undergone calibration, then the same changes should occur in the readings when the coil is again energized after movement of the magnetometer and installation at a test site. This check can be repeated at any time during, before, and after tests that may subject the magnetometer assembly to magnetic or mechanical stresses, thereby readily either lending credibility to the test results, or giving a direct indication that the magnetometer has lost its calibration, been damaged, or the like.

From the foregoing detailed description of a preferred exemplary embodiment of the invention, it will be appreciated that the aforemention objects and advantages have been accomplished thereby in a particularly effective and novel manner.

Obviously, other embodiments and modifications of the subject invention will readily come to the mind of one skilled in the art having the benefit of the teachings presented in the foregoing description and the drawing. It is, therefore, to be understood that this invention is not to be limited thereto and that said modifications and embodiments are intended to be included with the scope of the appended claims.

What is claimed is:

1. Magnetic field sensing apparatus including a magnetometer having a first, second, and third mutually orthogonal sensors responsive to magnetic field components along first, second, and third mutually orthogonal axes, respectively, and instrumentation means for individually measuring the responses of said sensors, said apparatus being characterized by the improvement comprising:

an electrically energizeable calibration checking coil, lying in a plane disposed at substantially like angles to each of said orthogonal axes, for subjecting each of said sensors to a predetermined change in magnetic field condition;

electrical control means, connected to said coil for energizing said coil with a predetermined current flow to provide said predetermined change in magnetic field condition at selected times, whereby changes in calibration of said magnetometer are detectable; and support means, interconnecting said magnetometer and said coil means, for maintaining said like angles.

2. Apparatus as defined in claim 1, and wherein:

said magnetometer comprises an elongate magnetometer body having its longer dimensions extending in the direction of one of said mutually orthogonal axes;

said support means comprises a support body having a recess, in which said magnetometer body is partially received and fixed against movement, and presents a plane surface lying at a predetermined angle to said longer dimensions and said one of said mutually orthogonal axes; and a coil form on which said calibration checking coil is wound, said coil form being mounted on said plane surface with a portion of said magnetometer body extending through said coil.

3. Apparatus as defined in claim 2, and wherein said plane is disposed at angles the tangent of each of which is substantially $\sqrt{2}/2$.

4. Apparatus as defined in claim 3, and further comprising:

housing means for enclosing said support means, said magnetometer, and said coil means;

first and second connecting means forming part of said housing means and said support means, respectively;

said first and second connecting means cooperating to adjustably position and magnetometer and said coil in rotation about one of said axes and relative to said housing.

5. Apparatus as defined in claim 4, and further comprising:

sleeve means, mounted at a location of operation of said magnetometer, for supporting said housing in a predetermined orientation, said sleeve means and said housing comprising cooperating index means for establishing said orientation.

6. A method of verifying calibration of a magnetometer including first, second, and third mutually orthogonal sensors responsive to magnetic field components along first, second, and third mutually orthogonal axes, respectively, and means for indicating the individual responses of said sensors, said method comprising the steps of:

providing a coil around said magnetometer and lying in a plane disposed at like angles to each of said axes;

calibrating said magnetometer by subjecting said magnetometer to determinable magnetic field conditions by means other than said coil and observing the responses of said sensors by said indicating means;

energizing said coil with a predetermined current;

observing the responses of said sensors, due to energization of said coil, as calibration reference values;

removing said magnetometer to its environment of use;

reenergizing said coil from time to time with said predetermined current;

observing the responses of said sensors due to reenergization of said coil; and comparing the responses of said sensors, due to reenergization of said coil, to said calibration reference values, whereby substantial equality therewith is indicative of continued proper operation and calibration of said magnetometer.

7. The method of claim 6, and wherein said plane is disposed at an angle of substantially 35.264° to each of said axes.

* * * * *